(12) United States Patent
Liu

(10) Patent No.: US 6,252,813 B1
(45) Date of Patent: Jun. 26, 2001

(54) READ ONLY MEMORY PRECHARGING CIRCUIT AND METHOD

(75) Inventor: Kwo-Jen Liu, San Jose, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/477,223

(22) Filed: Jan. 4, 2000

Related U.S. Application Data

(62) Division of application No. 09/238,531, filed on Jan. 27, 1999, now Pat. No. 6,147,893.
(51) Int. Cl.$^7$ ................................................. G11C 7/00
(52) U.S. Cl. ............................ 365/203; 365/104; 365/210
(58) Field of Search .................................. 365/203, 104, 365/210, 94

(56) References Cited

U.S. PATENT DOCUMENTS 4,601,017 * 7/1986 Mochizuki et al. .................. 365/203
4,670,666 * 6/1987 Yoshida ................................ 365/203

* cited by examiner

*Primary Examiner*—Vu A. Le
(74) *Attorney, Agent, or Firm*—Wagner, Murabito & Hao LLP

(57) ABSTRACT

A method and apparatus for programmable read only memory with high speed differential sensing at low operating voltage. In one embodiment, a programmable memory cell is comprised of word line, a bitline, and a transistor. The transistor, representing a single binary digit (bit), has a gate coupled to a word line, a drain coupled to a bitline, and a source capable of being programmed to provide a logic level of 0 and a logic level of 1. By programming the source of the transistor, the bitline approximately equal capacitance for both logic level 0 and logic level 1 states.

11 Claims, 13 Drawing Sheets

READ ONLY MEMORY PRECHARGING CIRCUIT AND METHOD

This application is a division of Ser. No. 09/238,531 filed Jan. 27, 1999, U.S. Pat. No. 6,147,893.

TECHNICAL FIELD

The present claimed invention relates to the field of semiconductor devices. Specifically, the present claimed invention relates to an apparatus and a method for storing and retrieving non-volatile read only memory.

BACKGROUND ART

Read only memory (ROM) is a vital component of modern computers. Beneficially, ROM is a non-volatile memory and, theoretically, can maintain the data it stores indefinitely without power. ROM data is configured in an array of memory cells, each of which has the capability of generating a binary digit. A binary digit is either a logic '1' (high voltage level) or a logic '0' (low voltage level). The basic component of a memory cell is a transistor and hence will be referred to as a memory cell transistor.

As mentioned, read only memory (ROM) is comprised of an array of memory cell transistors, each of which has the capability of generating a binary digit. A ROM circuit is formed by arranging a plurality of memory cell transistors into a matrix (rows and columns). Typically, two sets of 8 transistors are grouped in each row to create two 'bytes', or one 'word', of information for a given row. The gates of all the transistors in each row are connected to a horizontal conductor line referred to as a 'word line.' The purpose of the word line is to turn on the gates of all transistors grouped in that word line. Hence, the top word line, coupling sixteen memory cell transistors, is referred to as word line 0, the second word line, linking sixteen different memory cell transistors, is referred to as word line 1, and so on. An x-decoder interprets an input address code to determine the appropriate word-line to which the address refers and then enables that word line.

For a NOR logic arrangement of transistors, the memory cell transistors in a vertical column are either uncoupled from a vertical metal line called a bitline or are coupled in parallel to each other to the bitline. A separate bitline exists for each vertical column of memory cell transistors. For example, sixteen bitlines exist for a word of bits (e.g. 16 binary digits or memory cell transistors in a row). The bitline communicates the actual logic level of the memory cell transistors to other portions of the ROM circuit. A y-decoder interprets an input address code to determine the appropriate bitline to which the address refers and then enables that bitline. With this grid of horizontal and vertical metal lines, each memory cell transistor, and its logic level, can be accessed by enabling the appropriate word line and appropriate bitline to which the desired memory cell transistor is coupled.

Prior Art FIG. 1 illustrates a pair of conventional memory cell transistors within a ROM circuit 100. Memory cell transistor 102 represents a logic level '0' as its drain 103 couples bitline 104 to ground 190. When gate 116 of memory cell transistor 102 is enabled by word line 114, to which it is coupled, its source 118, is coupled to ground 190 via its drain 103. Thus, when bitline 104 is precharged, its voltage level will go to ground because of the coupling just described.

Conversely, memory cell transistor 106 represents a logic level '1' as its drain 107 is uncoupled from bitline 108. When gate 112 of memory cell transistor 106 is enabled by word line 114, to which it is coupled, its source 110, coupled to ground 190, is thereby coupled to ground 190 via its drain 107. Thus, when bitline 108 is precharged, its voltage level will remain at the voltage level of the precharge because of the coupling arrangement just described.

However, the difference in the typical configuration of the memory cell transistors for logic level 0 and logic level 1 state in the prior art creates a problem,. Because memory cell transistor 102 representing a logic level of 0 is coupled to the bitline 104, its transistor body adds capacitance to the bitline in which it is grouped. Conversely, a memory cell transistor 106 representing a logic level of 1 has no portion of the memory cell transistor 106 coupled to bitline 108. Hence it adds no capacitance to bitline 108 in which it is grouped.

Although the difference in capacitance of an individual memory cell transistor may be small, its effect is amplified in at least two circumstances. First, many transistors can be grouped in a single bitline and thus, the additive effect of their capacitance can be substantial. Second, bitlines may be polarized, e.g. have data memory transistors of all one state. Thus, for example, it is possible that all the data memory transistors in one bitline could have 0 logic (increasing the capacitive load on the bitline by the sum of the individual capacitance) while all the data memory transistors in another bitline could have 1 logic (adding no capacitive load to the bitline). With this polarized difference, a significant variation in bitline capacitive loading can occur within the ROM circuit.

Consequently, the variation of the capacitance in bitlines can create a corresponding variation in the precharging and subsequent voltage level and phase from one bitline to the next. As a result of this drawback in the prior art, a need exists in a ROM circuit for a data memory transistor that has an approximately equivalent capacitive loading on the bitline in both the logic 0 state and the logic 1 state.

Prior Art FIG. 2 illustrates a conventional precharge and sensing circuit 200 for conventional ROM memory. Memory cell 202 represents a single memory cell transistor, as discussed above for FIG. 1, as enabled by its corresponding word line 114 and bitline 104. Reference cell 204 has a logic level that will be compared against the logic level of memory cell 202 following a precharge step. PMOS pull-up transistor 206, coupled to power supply voltage 208, supplies a precharge voltage level to memory cell 202 while PMOS pull-up transistor 210, coupled to power supply voltage 212, supplies a voltage level to reference cell 204.

However, NMOS pull-up transistor 214, coupled to power supply 216, and NMOS pull-up transistor 218, coupled to power supply 220, prevent memory cell 202 and reference cell 204 respectively, from achieving a precharge voltage level equivalent to that of power supply 208 and 212. Assuming all power supply voltages 208, 212, 216, and 218 are equivalent, NMOS pull-up transistor 214 and 218 and NMOS bias transistors 222 and 224, for memory cell 202 and reference cell 204 respectively, require a voltage at the source electrode of the transistor to be less than or equal to the gate voltage minus the characteristic threshold voltage of the NMOS transistor.

In other words, memory cell 202 and reference cell 204 cannot be charged to a voltage level equivalent to the voltage level equivalent to that of power supply 208, 212, 216, and 218. Rather, memory cell 202 and reference cell 204 can only be charged to a voltage level equivalent to the voltage level of power supply 208, 212, 216, and 218 minus the threshold voltage level of the NMOS transistors. This prevents the circuit from operating at a power supply voltage level that is less than minimum high logic voltage level plus the threshold voltage. Consequently, a need exists for a precharge circuit with the capability to provide an improved voltage level to memory cell 202 and reference cell 204 when power supply 208, 212, 215 and 220 are at a low-voltage condition.

Additionally, the conventional precharge circuit uses only a single PMOS pull-up transistor 206 and 210 to precharge the memory cell and reference cell respectively. The resultant speed at which the cells are precharged is subsequently limited by this configuration. The limitation subsequently slows down the entire memory retrieval process of ROM data. Consequently, a need exists for a precharge circuit that will precharge the cells in a faster manner.

As a final feature of the conventional precharge circuit, the PMOS pull-up transistor 206 and 210 independently precharge the memory cell and reference cell respectively. Because variation can occur in the individual PMOS transistors and the circuitry leading to the cells, it is possible that the precharge voltage level supplied to the reference cell may be different than the precharge voltage level supplied to the memory cell. Having different precharge voltage levels for the memory and reference cell subsequently consumes a portion of the allowable noise margin in the sensing operation. To improve the noise margin for other variations in the sensing operation, a need exists for reduced variation in the voltage level supplied to the memory cell and reference cell during the precharge operation.

Prior Art FIG. 2 also illustrates sense amplifier 226 used to compare the logic levels of reference cell 204 and memory cell 202 and provide an output equivalent to the logic level of memory cell 202. As mentioned previously, the bitline capacitance can have a significant amount of variation due to the variation in logic levels of memory cell transistors to which it is coupled. Because the reference cell, e.g. dummy bitline, configuration does not change, it thereby has a constant capacitance. Consequently, when the voltage level of the reference cell with a constant capacitance is compared to the voltage level of a bitlines, whose capacitance could be radically different from any other bitline, a significant variation in voltage amplitude and phase can occur. As a result, the sense amplifier that measures the differences in voltage amplitude and phase between the memory cell and the reference cell may misinterpret a phase shift as a logic level different from what the memory cell actually is. Hence, the entire sensing operation may be prone to error or may require a longer amount of time to achieve a steady state conditions for all the potential variations in capacitance of a bitline. In view of these limitations, a need exists for a dummy bitline configuration with approximately equivalent capacitance as a bitline such that sensing speed and accuracy may be enhanced.

The conventional sensing operation of a memory cell only references one memory cell 202 as indicated in Prior Art FIG. 2. Although not indicated in Prior Art FIG. 2, the balance of the memory cells in a ROM circuit having a plurality of memory cells and bitlines are left floating with whatever residual charges they may have in their respective bitline. Interestingly, the bitlines contain a metal conductor line that must be separated by insulators from adjacent bitlines in order to prevent a short circuit. Hence, an unintended capacitive structure evolves between adjacent bitlines. Unfortunately, residual charges left on disabled bitlines surrounding the enabled bitline to be sensed will influence the amount of precharge accepted on the desired bitline and will influence the phase and amplitude of the signal from the desired bitline during the subsequent sensing operation. This influence, commonly referred to as 'cross-talk,' consumes some of the noise margin in the sensing operation and may lead to errors in output and overall degraded performance of the ROM circuit. Because of the potential drawbacks of the conventional operation, a need exists for reducing cross-talk between adjacent bitlines and reducing its negative side-effects.

In summary, a need exists for a data memory transistor, within a ROM circuit, that has more consistent capacitive loading on the bitline in both the logic 0 state and the logic 1 state. Furthermore, a need exists for a precharge circuit, within a ROM circuit, with the capability to provide an acceptable voltage level to the memory cell and the reference cell at low-voltage power supply conditions. At the same time, a need exists for the precharge circuit to precharge the cells in a faster manner. Besides the aforementioned needs, a further need exists for reduced noise in the voltage level supplied to the memory cell and reference cell during the precharge operation. Still another need exists for a dummy bitline configuration with approximately equivalent capacitance as a bitline such that sensing speed and accuracy may be enhanced. Finally, a need exists for reducing cross-talk between adjacent bitlines and reducing its negative side-effects.

DISCLOSURE OF THE INVENTION

The present invention provides a data memory transistor, for use within a ROM circuit, that has more consistent capacitive loading on the bitline in both the logic 0 state and the logic 1 state. The present invention further provides a precharge circuit, for use within a ROM circuit, with the capability to provide an acceptable voltage level to the memory cell and the reference cell at low-voltage power supply conditions. The precharge circuit of the present invention can also precharge the cells in a faster manner. Additionally, the present invention provides reduced noise in the voltage level supplied to the memory cell and reference cell during the precharge operation. Furthermore, the present invention provides a dummy bitline configuration with approximately equivalent capacitance as a bitline such that sensing speed and accuracy may be enhanced. Finally, the present invention provides reduced cross-talk between adjacent bitlines and reducing its negative side-effects.

Specifically, in one embodiment, the present invention recites a source-programmable memory cell comprised of a word line, a bitline, and a transistor. The transistor, representing a single binary digit (bit), has a gate coupled to a word line, a drain coupled to a bitline, and a source capable of being programmed to provide a logic level of 0 and a logic level of 1. By programming the source of the transistor, the bitline has approximately equal capacitance for both logic level 0 and logic level 1 states.

In another embodiment, the present invention recites a method of selecting and precharging bitlines in a manner that reduces coupling capacitance between adjacent bitlines. One step enables the desired bitline. Another step grounds all non-enabled bitlines that are coupled to the desired bitline. In the next step, the desired bitline is precharged. And finally, in the last step the voltage of the desired bitline is sensed.

These and other objects and advantages of the present invention will no doubt become obvious to those of ordinary skill in the art after having read the following detailed description of the preferred embodiments illustrated in the various drawing figures.

BRIEF DESCRIPTION OF THE DRAWINGS

The accompanying drawings, which are incorporated in and form part of this specification, illustrate embodiments of the invention and, together with the description, serve to explain the principles of the invention.

PRIOR ART

PRIOR ART

The drawings referred to in this description should be understood as not being drawn to scale except as specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

CIRCUIT DESCRIPTIONS

Figure 1:
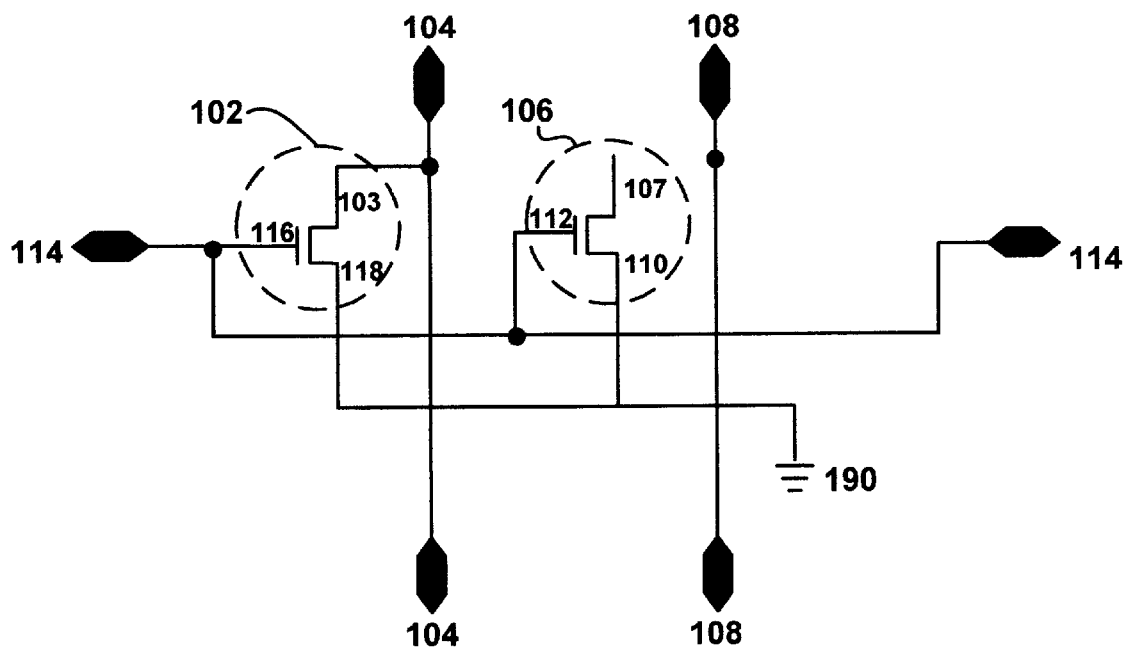
FIG. 1 is an electrical schematic of a conventional data memory cell with a logic 0 and a logic 1 state.
Figure 2:
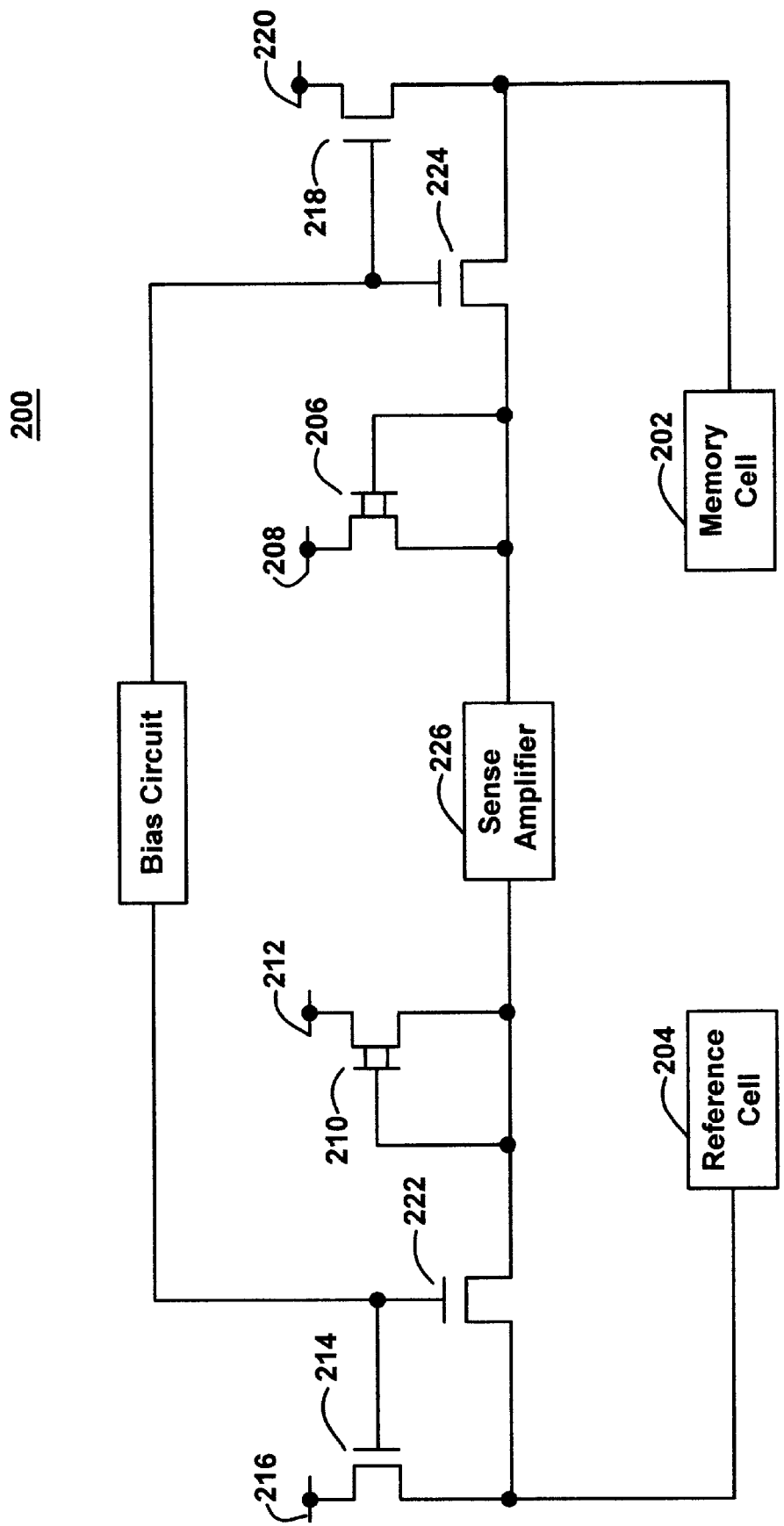
FIG. 2 is a block diagram of the precharge and sensing portion of a ROM circuit.
Figure 3:
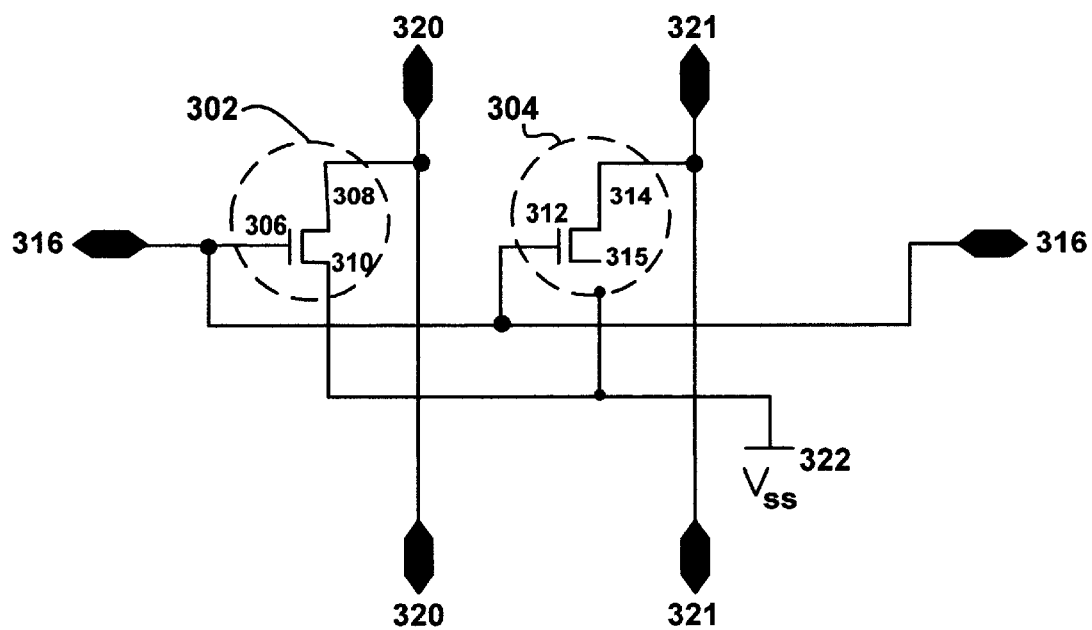
FIG. 3 is an electrical schematic of a data memory cell with a logic 0 and a logic 1 state in accordance with one embodiment of the present invention.

With reference now to FIG. 3, a low-logic memory cell transistor 302 and a high-logic memory cell transistor 304 within a read only memory (ROM) circuit 300 having high-speed differential sensing at low operating voltages is presented. These two basic states of memory cells are the building blocks of ROM memory. Embodiments of the electrical apparatus for the present invention will be described in detail below. Afterwards, embodiments of the methods and steps used in the present invention will be described in detail.

In the present embodiment of FIG. 3, low-logic memory cell transistor 302 is comprised of a gate 306, a drain 308, and a source 310. Similarly, high-logic memory cell transistor 304 is comprised of a gate 312, a drain 314, and a source 315. A word line lead 316 is coupled to gate 306 and gate 312, thereby providing the voltage necessary to turn both memory cell transistors 302 and 304 on and off. A first bitline 320 is coupled to drain 308 of memory cell transistor 302 while a second bitline 321 is coupled to drain 314 of memory cell transistor 304. The two states of memory cell transistors, as illustrated in memory cell transistors 302 and 304, are distinguished by whether their sources 310 and 315 are coupled to low-voltage power supply 322. Low-logic memory cell transistor 302 has its source 310 coupled to low-voltage power supply 322.

In contrast, high-logic memory cell transistor 304 has its source 315 uncoupled from low-voltage power supply 322. Herein lies one benefit of the present embodiment of the present invention. By configuring memory cell transistor 302 and 304 at its source 310 and 315 respectively, both logic states have approximately equal capacitance, and hence will load bitlines 320 and 321 respectively to which they are grouped, equivalently. Hence, the performance of the bitline will be very consistent during a precharge and sensing operation for reading the ROM memory. As a result, the memory cell transistor 302 and 304 and the ROM circuit 300 of the present embodiment will have less noise, and can operate at lower noise margins and voltage levels. In one embodiment of the present invention, low-voltage power supply 322 is zero voltage.

In general, a memory cell transistor is the basic building block of ROM memory, a memory cell transistor is enabled by a word line, and the logic level of a memory cell is sensed by a bitline. In this manner, each memory cell transistor (representing a binary digit, e.g. bit) can be individually accessed.

While the present embodiment of FIG. 3 illustrates memory cell transistors 302 and 304 as an NMOS transistor, the present invention is equally well suited to alternative transistor configurations known in the art. Furthermore, the present embodiment is well-suited to including additional elements in the circuit, other than those illustrated, that may enhance its performance.

Figure 4:
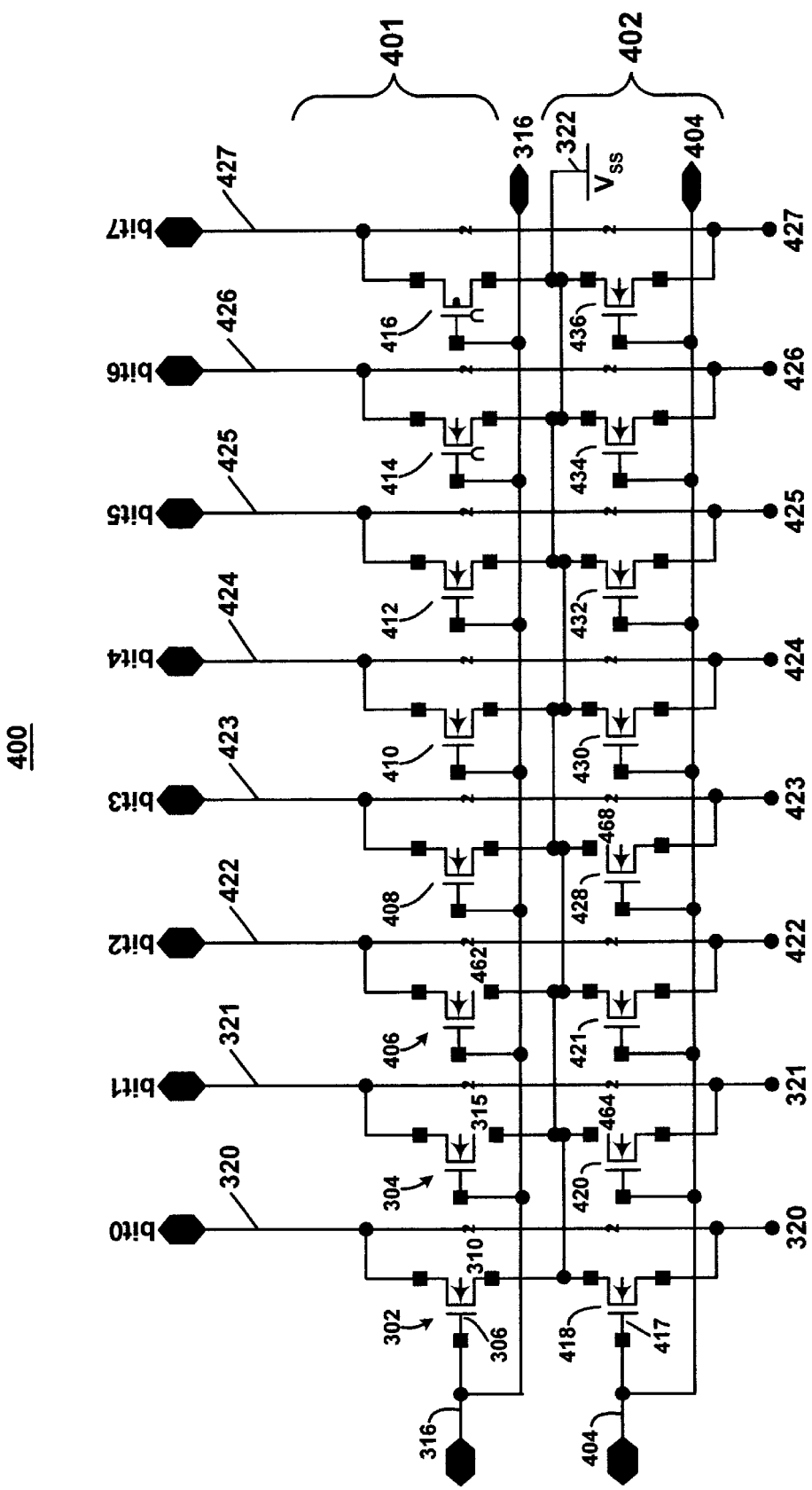
FIG. 4 is an electrical schematic of a matrix of data memory cells, forming a portion of a ROM circuit, including a dummy bitline in accordance with one embodiment of the present invention.

Referring now to FIG. 4, one embodiment of a memory cell matrix 400, within a ROM circuit, is presented. A matrix arrangement of sixteen memory cells is presented in a first row, referred to as a word line 401, and a second row, referred to as a word line 403, of 8 memory cell transistors each. Memory cell transistors 302, 304, 406, 408, 410, 412, 414, and 416 are sequentially arranged in the first row to represent 8 bits of data, or a byte of information. Two bytes of information form a 'word' of information. Typically, two rows of 8 memory cell transistors are configured side by side to provide a word of information. However, for this illustration, only one row of 8 memory cell transistors are provided for simplicity. The present embodiment is well suited to any number of memory cell transistors arranged in any number of word lines and bitlines. Memory cell transistors 302, 304, 406, 408, 410, 412, 414 and 416 of the present embodiment are coupled to a word line lead 316 within word line 401. Likewise, word line 402 is comprised of eight memory cell transistors 418, 420, 421, 428, 430, 432, 434 and 436, sequentially arranged and coupled to word line lead 404.

FIG. 4 illustrates how variations in the logic levels of bitlines can occur. For example, memory cell transistors 302, 408, 410, 412, 414, and 416 are configured as logic level '0.' In contrast, memory cell transistors 304, 406, 420 and 428 are configured as logic level '1.' Thus, bitline 320 has two memory cell transistors 306 and 417 at logic level '0', bitline 321 has two memory cell transistors 304 and 420 at logic level '1', and bitline 422 has one memory cell transistor 406 at logic level '1', and one memory cell transistor 421 at logic level '0.' Naturally, any permutation can exist for logic levels of memory cell transistors within a bitline. In a large matrix of memory data cells, a significant range of variation can exist. However, with the present embodiment, the capacitance of memory cell transistors with logic level '0' and logic level '1' have approximately equivalent capacitance as indicated for FIG. 3. Consequently, the present embodiment overcomes the problem of capacitive variation in prior art memory cell transistors and bitlines.

Memory cell transistors illustrated in FIG. 4 are coupled identically to those illustrated in FIG. 3. The major difference is that more memory cell transistors are illustrated in FIG. 4 and are configured as a matrix rather than an array. In FIG. 4, two word lines 401 and 402 are illustrated and seven bitlines 320, 321, 422, 423, 424, 425, 426 and 427 are presented to represent a byte, or seven binary digits, of data, that are subsequently coupled to corresponding leads in the column-select circuit 500 of FIG. 5.

Figure 5:
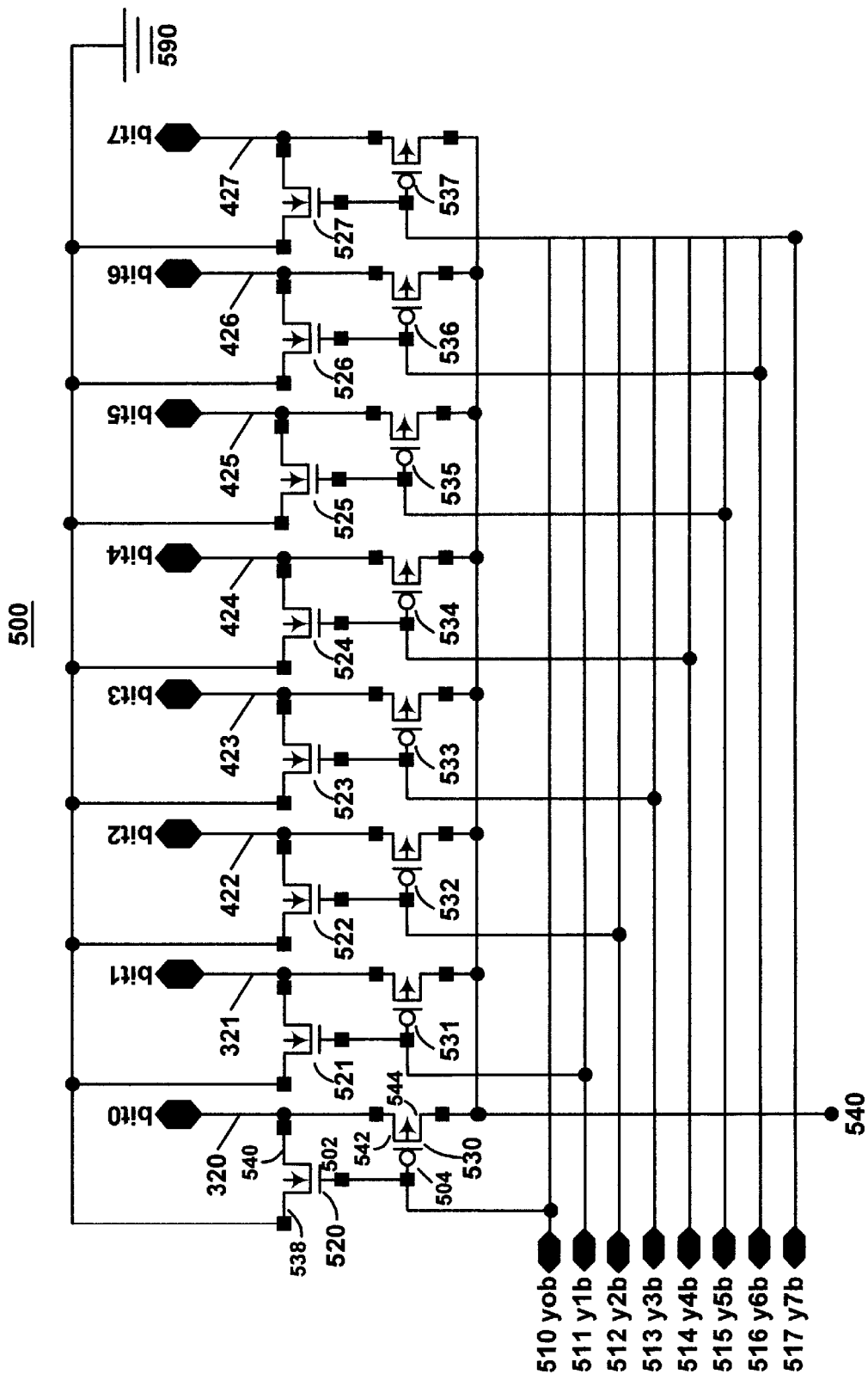
FIG. 5 is an electrical schematic of a column select circuit portion of a ROM circuit in accordance with one embodiment of the present invention.

Referring now to FIG. 5, a column-select circuit 500, within a ROM circuit, is presented. The circuit is comprised of a plurality of column-enable leads 510, 511, 512, 513, 514, 515, 516 and 517, a plurality of grounding transistors 520, 521, 522, 523, 524, 525, 526 and 527, a plurality of precharging transistors 530, 531, 532, 533, 534, 535, 536 and 537. The elements of column-select circuit 500 are grouped to an individual respective bitline that they will control. While the present embodiment provides a specific quantity of transistors and column-enable lead sets, the present invention is equally well-suited to using a lesser or greater quantity of sets. For example, it is common to construct ROM cells in 16 bit widths such that a 'word' of binary information can be stored and accessed. A simpler 8-bit width of cells is presented herein for clarity.

The specific construction of only one set of components in column-select circuit 500 will be described herein. The balance of the circuit essentially repeats this set of components. In general, a set of components includes column-enable lead 510, grounding transistor 520, and precharging transistor 530. Column-enable lead 510 is coupled to gate 502 of grounding transistor 520 and to gate 504 of precharging transistor 530. In the present embodiment, grounding transistor 520 is a NMOS configuration, metal oxide semiconductor field effect transistor (MOSFET), while precharging transistor 521 is a PMOS configuration MOSFET. In general, the combination of a PMOS and NMOS transistor acts as a toggle, e.g. complementary metal oxide semiconductor (CMOS). Although the present embodiment utilizes these transistor configurations, the present invention is equally well suited to alternative transistor configurations. Additionally, the present invention is equally well suited to swapping respective transistor configurations of the present embodiment (and consequently reversing the polarity of an enable signal).

Still referring to FIG. 5, grounding transistor 520 has source 538 coupled to ground 590 and drain 540 coupled to bitline 320. Similarly, precharge transistor 530 has a source 542 coupled to bitline 320 and drain 544 coupled to precharge circuit lead 540. In this manner, each bitline 320, 321, 422, 423, 424, 425, 426 and 427 in the ROM circuit is selectively coupled to ground 590 or precharge circuit 600, as determined by its respective column-enable lead 510, 511, 512, 513, 514, 515, 516 and 517. Furthermore, the CMOS configuration allows the switching between ground 590 and precharge enable lead 540 to occur simultaneously and with low power consumption.

Figure 6:
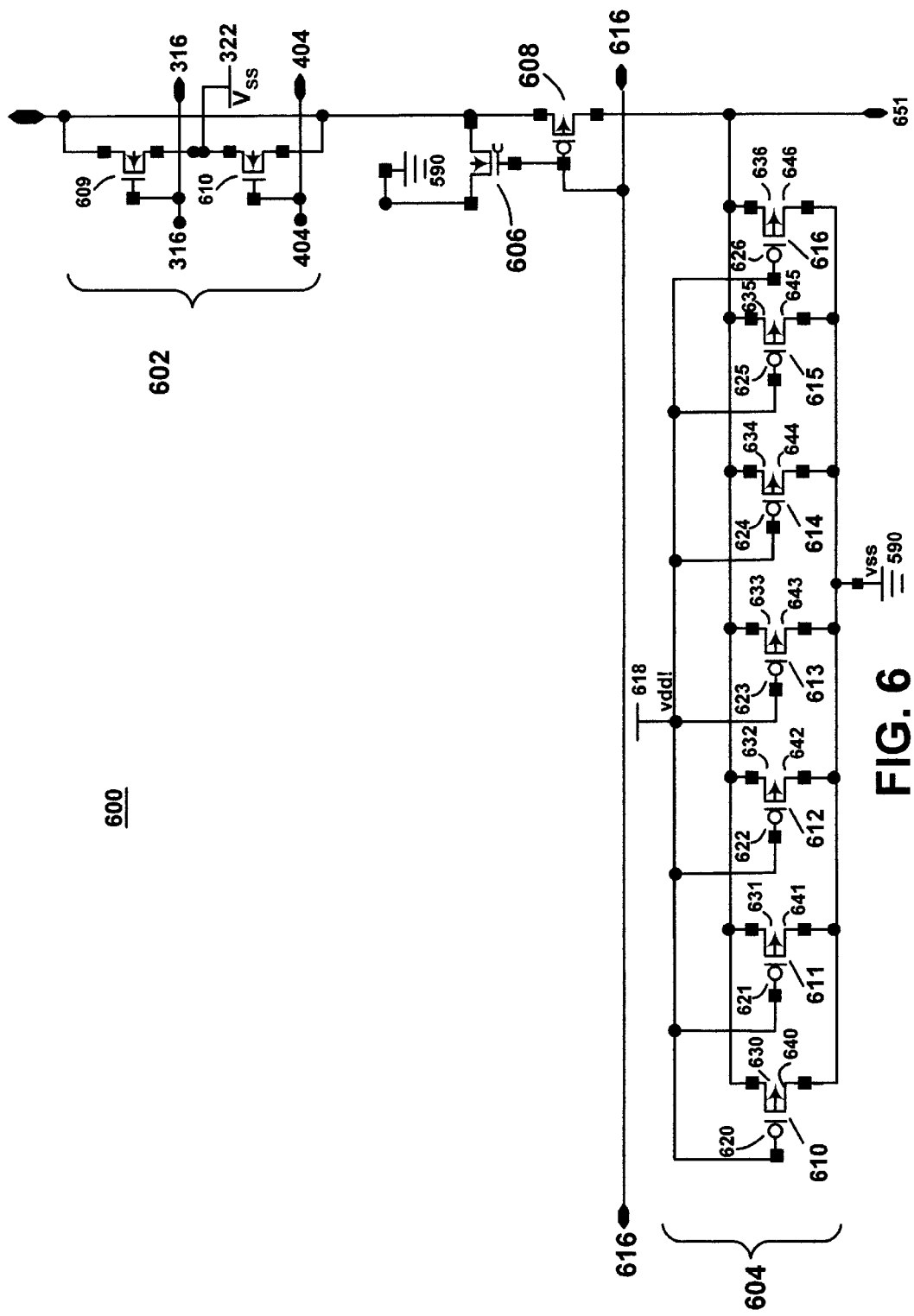
FIG. 6 is an electrical schematic of a dummy column load circuit portion of a ROM circuit in accordance with one embodiment of the present invention.

Referring now to FIG. 6, a dummy circuit 600 within a ROM circuit is presented. Dummy circuit 600 is comprised of, in general, dummy bitline load 602, dummy column-select load 604, dummy circuit enable lead 616, and precharging transistor 608. Precharging transistor 608 and grounding transistor 606 are essentially identical to those illustrated in FIG. 5 but are applied to a dummy bitline load 602 rather than a bitline 320, 321, 422, 423, 424, 425, 426 and 427.

More specifically, in the present embodiment, dummy bitline load 602 is comprised of memory-cell transistors 609 and 610 coupled as described in FIGS. 3 and 4. In the present embodiment, memory cell transistors 609 and 610 are both configured as logic level '0' while in an alternative embodiment, memory cell transistors 609 and 610 may be configured as logic level '1.' Additionally, in the present embodiment, the same quantity of memory cell transistors 609 and 610 exist in dummy bitline load 602 as would exist in typical bitline, e.g. bitline 320. However, memory cell transistors 609 and 610 in the present embodiment have a channel length that is approximately twice as long as that in typical memory cell transistor, e.g. memory cell transistor 302. The longer length channel provides enhanced performance of the dummy circuit for subsequent sensing operation described herein.

Still referring to FIG. 6, in the present embodiment, dummy column-select load 604 is comprised of six PMOS transistors 610, 611, 612, 613, 614, 615 and 616. Gates 620, 621, 622, 623, 624, 625 and 626 are all coupled to power supply 618 having a high voltage level. Sources 630, 631, 632, 633, 634, 635 and 636 are all coupled to dummy circuit enable lead 616. Finally, drains 640, 641, 642, 643, 644, 645 and 646 are all coupled to ground 590. The quantity of transistors in dummy column-select load 604, and their respective coupling, represents the capacitive loading on precharge transistors, e.g. 531, 532, 533, 534, 535, 536 and 537, of non-desired bitlines, e.g. bitlines 321, 422, 423, 424, 425, 426 and 427 respectively. While the present embodiment utilizes the same type and construction of transistor as precharge transistor, e.g. 531, shown in FIG. 5, the present invention is well suited to alternative embodiments, such as a lumped capacitive load, that provide an approximately equivalent capacitive load as indicated above.

Figure 7:
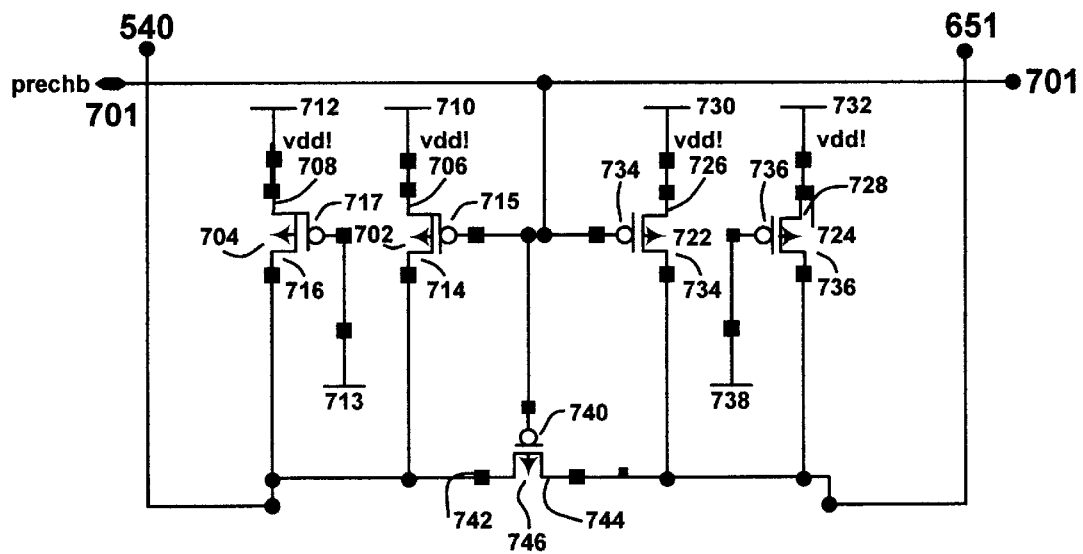
FIG. 7 is an electrical schematic of a precharge circuit portion of a ROM circuit, in accordance with one embodiment of the present invention.

Referring now to FIG. 7, precharge circuit 700 within a ROM circuit is presented. Precharge circuit 700 is comprised of dynamic PMOS pull-up transistor 702 and static PMOS pull-up transistor 704 whose sources 706 and 708 are respectively coupled to power supply 710 and 712, and whose drains 714, 716 are both coupled to precharge lead 540. Note that gate 717 of static PMOS transistor 704 is coupled to power supply voltage 713 while gate 715 of dynamic PMOS transistor 702 is coupled to precharge enable lead 701. In this manner, dynamic and static PMOS pull-up transistors 702, 704 respectively, provide the voltage level of power supply 710 and 712 to precharge transistors 530, 531, 532, 533, 534, 535, 536 and 537 of column-select circuit 500.

Similarly, precharge circuit 700 is comprised of dynamic PMOS pull-up transistor 722 and static PMOS pull-up transistor 724 whose drains 726 and 728 are respectively coupled to power supply 730, 732 and whose sources 734, 736 are both coupled to dummy load line 651. Again note that gate 736 of static PMOS transistor 724 is coupled to power supply voltage 738 while gate 734 of dynamic PMOS transistor 722 is coupled to precharge enable lead 701. In this manner, dynamic and static PMOS pull-up transistors 722 and 724 provide a voltage level of power supply 730 and 732 respectively, to precharge dummy circuit 600.

Finally, precharge circuit 700 has an equalizing transistor 746 whose gate is coupled to precharge enable lead 701. One electrode 742 of equalizing transistor 746 is coupled to precharge lead 540 for column select circuit 500, while the other electrode 744 is coupled to dummy load line 651 for dummy circuit 600. The equalizing transistor thus ensures an approximately equal noise level supplied to both precharge lead 540 and dummy load line 651. This feature has the desirable effect of providing noise-immune precharge voltages for both bitlines 320, 321, 422, 423, 424, 425, 426 and 427 and for dummy circuit 600.

Figure 8:
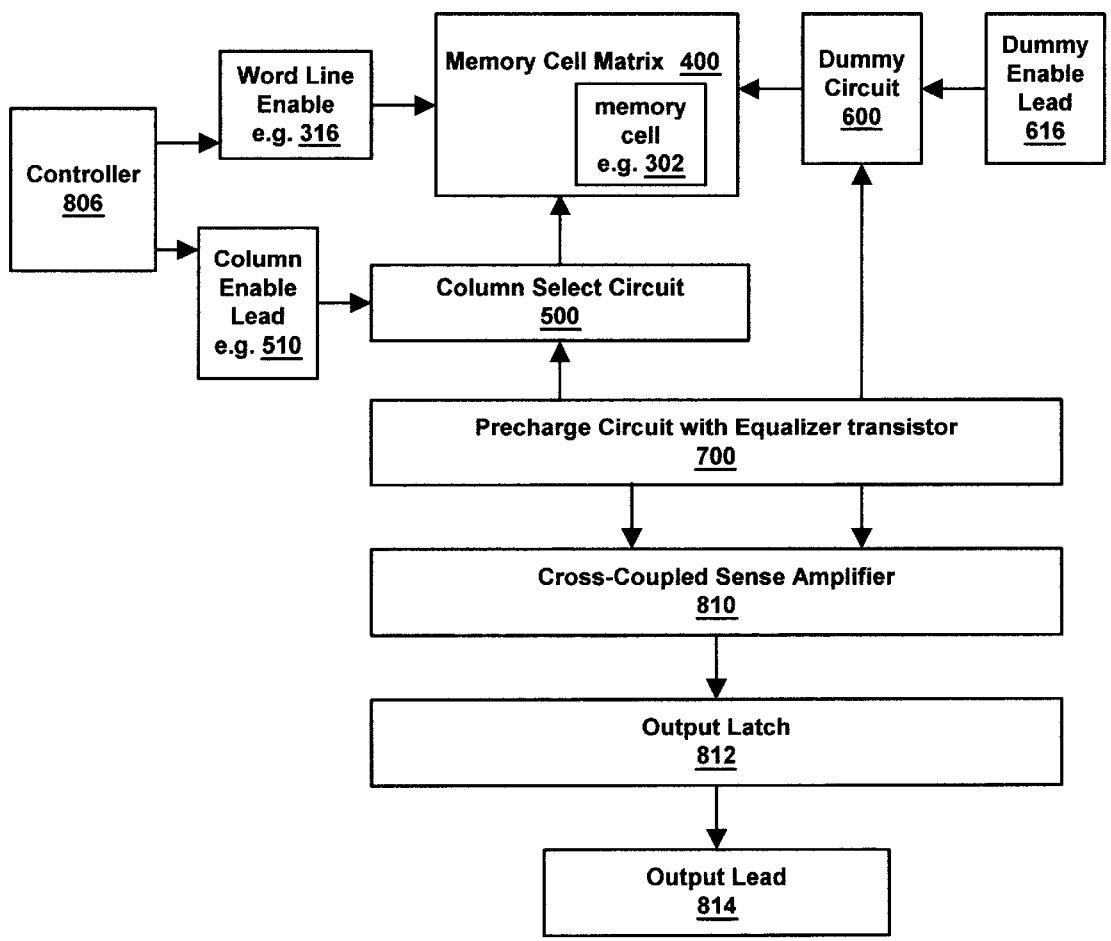
FIG. 8 is a block diagram of a ROM circuit incorporating a precharge circuit, memory cell array, column select circuit, cross-coupled sense amplifier and output latch, in accordance with one embodiment of the present invention.

Referring now to FIG. 8, a block diagram 800 of ROM circuit 300 incorporating multiple embodiments for portions of the ROM circuit 300 in accordance with the present invention is presented. More specifically, the block diagram 800 presents the interrelation between memory cell matrix 400, column select circuit 500, dummy circuit 600, precharge circuit 700, cross-coupled sense amplifier 810 and output latch 812 is presented in accordance with one embodiment of the present invention.

Word enable line, e.g. 316 and column enable lead, e.g. 510 are coupled in a manner to provide a cross reference single memory cell transistor, e.g. 302, within memory cell matrix 400. Dummy enable lead 616 and memory cell matrix 400 are coupled to dummy circuit 600. Precharge circuit 700 is coupled to both column select circuit 500 and dummy circuit 600- in order to provide voltage levels for determining logic level of a single memory cell, e.g. 302, within memory cell matrix 400. Cross-coupled sense amplifier 810 is coupled to precharge circuit 700 and subsequently to memory cell matrix 400. Output latch 812 is coupled to cross-coupled sense amplifier 810. From output latch 812 is obtained output signal 814 containing a logic level of single memory cell 801.

METHOD OF CIRCUIT OPERATION

Figure 9:
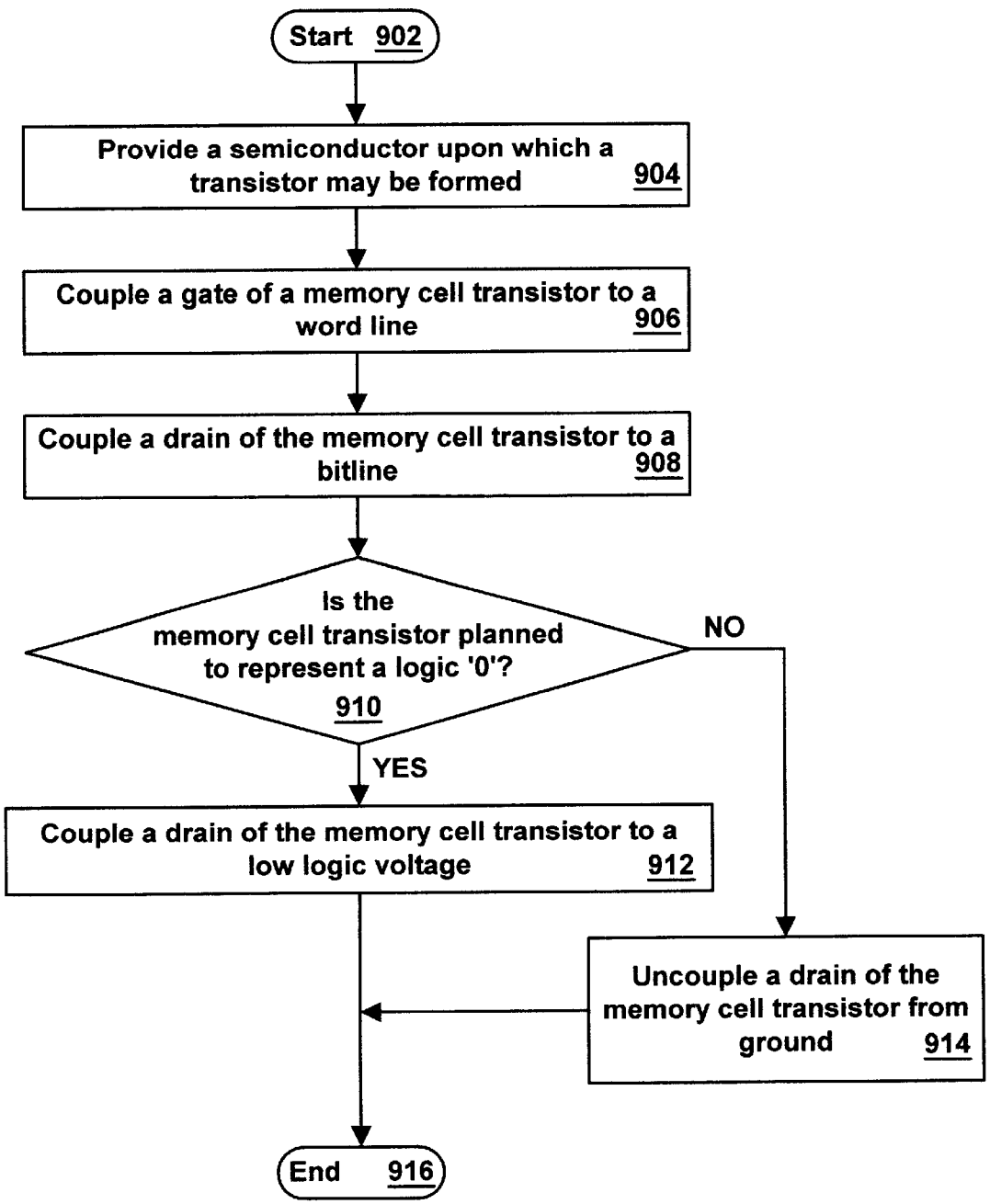
FIG. 9 is a flow chart of the steps performed to create a logic level 0 and 1 in a memory cell transistor in accordance with one embodiment of the present invention.

Referring now to FIG. 9, a flowchart 900 of the steps performed for creating a portion of a ROM memory circuit 300 of FIGS. 3–8 is presented. More specifically, FIG. 9 presents the steps for creating a memory cell that has an approximately equivalent capacitance in both a logic '0' and a logic '1' state, in accordance with one embodiment of the present invention. As a result of the memory cells having approximately equal capacitance for both states, bitlines that contain multiple memory cells will likewise have approximately equivalent capacitance. In turn, the constant capacitance creates a uniform response from all bitlines in ROM memory circuit 300. Improved noise capacity and speed are thereby obtained.

As shown in FIG. 9, first step 904 provides a semiconductor upon which a transistor may be formed. In the present embodiment, a transistor 302 as shown in FIG. 3, is the basic building block of ROM memory. The transistor acts as a switch that either couples bitline 318 to ground 322, thereby providing a low voltage (logic) level, or isolates bitline 318 from ground 322, thereby providing a high voltage (logic) level to be sensed at the bitline. In the present embodiment, a NMOS metal oxide semiconductor field effect transistor is utilized. However, the present invention is well suited to using multiple other transistor configurations.

In step 906 of FIG. 9, a gate of a memory cell transistor is coupled to a word line. As shown in FIG. 3, this step is implemented by coupling gates 306 and 312 of memory cell transistors 302 and 304 respectively, to word line 316 in which they are grouped. When a matrix of memory cell transistors exist, as shown in FIG. 4, they are grouped into separate word lines 430 and 432. While FIG. 4 only shows two word lines 316 and 404, the present embodiment is well suited to using less or more word lines. The point is that gate 306 in word line 401 and that gate 417 in word line 402 are only coupled to word line lead 316 and 404 respectively, located within word line their respectively word line in which they and 446 are only coupled to the word line lead 401 and 402 respectively, in which they are grouped. In this manner, when word line 401 is enabled, it turns on all memory cell transistors 302, 304, 406, 408, 410, 412, 414, and 416 that are grouped within it. In this manner, a row of data in the form of memory cell transistors 302, 304, 406, 408, 410, 412, 414, and 416 may be referenced individually from the balance of rows in the circuit.

In step 908 of FIG. 9, a drain of the memory cell transistor is coupled to a bitline. As illustrated in FIG. 3, this step is implemented by coupling drain 308 and 314 to bitline 320 and 321, respectively. Note that, even though memory cell transistor 302 is configured as a logic level '0' and memory cell transistor 304 is configured as a logic level '1', they both have their drains 308 and 314 respectively, coupled to the bitline in which they are grouped, e.g. bitline 320 and 321 respectively. In this manner, the state of a memory cell transistor is not determined by the coupling configuration of the drain, as is done in the prior art.

In step 910 of FIG. 9, a query is presented asking whether the memory cell transistor planned is to represent a logic '0?' Step 910 represents the binary states present in digital systems. If the answer to the query of step 910 is 'yes' then a logic '0' is desired for the memory cell in question and step 912 should be implemented.

If the answer to query of step 910 is 'no' then a logic '1' is desired and step 914 should be implemented.

In step 912 of FIG. 9, a source of the memory cell transistor is coupled to low logic voltage in order to configure the memory cell transistor as a logic '0' state. As illustrated in FIG. 3, this step is implemented by coupling source 310 to voltage level Vss 322. In this manner, when voltage is supplied to bitline 320, and word line lead 316 is enabled, memory cell transistor 302 is 'on' and conducts to low logic voltage 322. Hence, when bitline is sensed, it will read a low logic voltage. This is in contrast to the alternative logic state presented next.

In step 914 of FIG. 9, a source from the memory cell transistor is uncoupled from low logic voltage. As illustrated in FIG. 3, this step is implemented in memory cell transistor 304 by either not coupling drain 315 to low logic voltage source 322 or by removing any coupling that existed between drain 315 and low logic voltage source 322. However, because drain 314 of memory cell transistor 304 is still coupled to bitline 321, it adds the capacitive value of its transistor body and leads to the bitline in which it is coupled. In this manner, the capacitive value on bitline 321 with a logic level '1' memory cell transistor is approximately equivalent to the bitline 320 with a logic level '0' memory cell transistor.

Thus, flowchart 900 have presented the steps performed for creating a memory cell that has an approximately equivalent capacitance in both a logic '0' and a logic '1' state, in accordance with one embodiment of the present invention. Improved noise capacity and speed consequently arise from the matched capacitance of memory cell transistors and the bitlines to which they are coupled..

Figure 10:
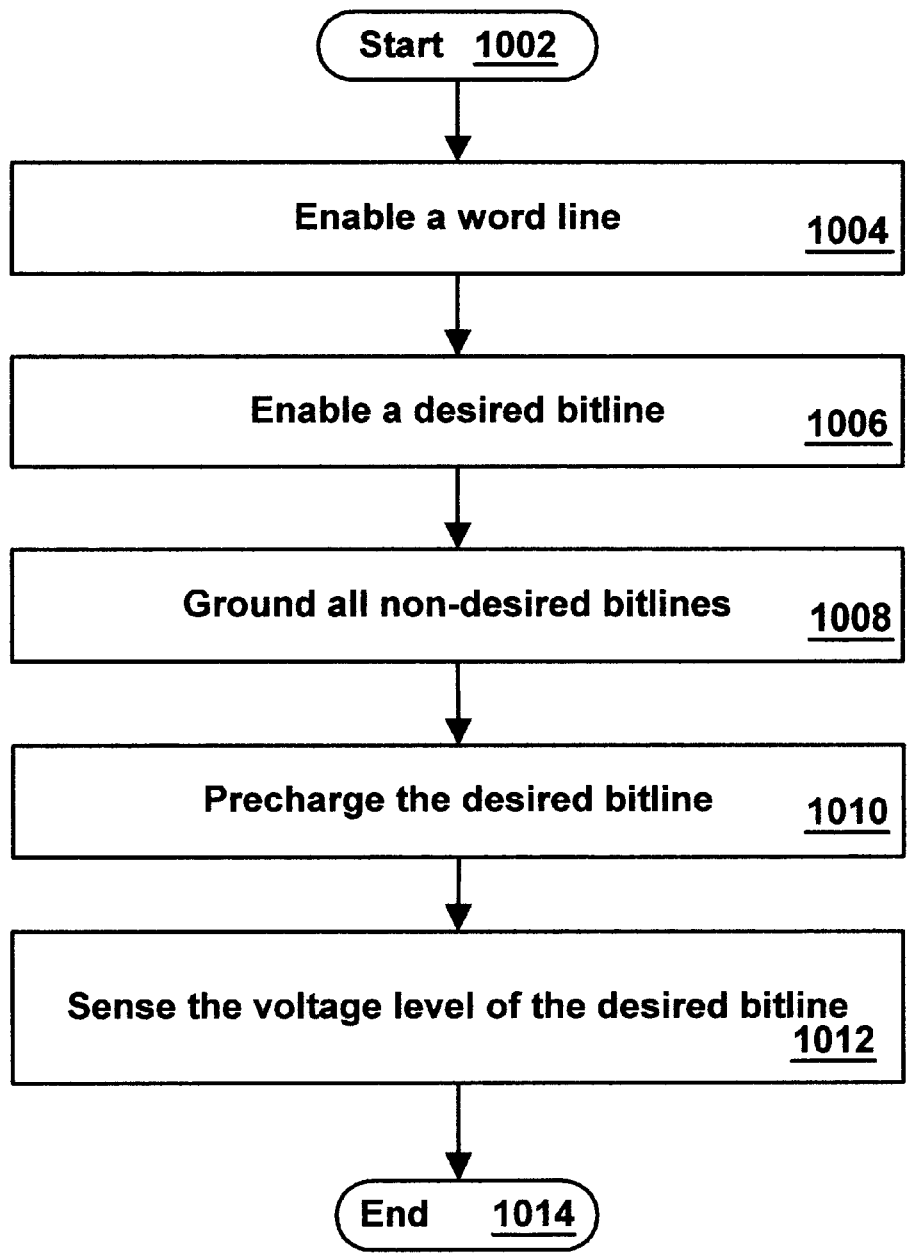
FIG. 10 is flow chart of the steps performed to select and precharge a bitline within a ROM circuit in accordance with one embodiment of the present invention.

Referring now to FIG. 10, a flowchart 1000 of the steps performed for reading a portion of a ROM memory circuit 300 of FIGS. 3–8 is presented. More specifically, FIG. 10 presents the method for charging and sensing a bitline in which a memory cell to be read resides in one embodiment of the present invention. The present embodiment has the benefit of reducing cross-talk between a selected bitline and the bitlines adjacent to it. Consequently, the voltage level sensed from a selected bitline is more accurate because its voltage level is not altered by adjacent bitlines.

As shown in FIG. 9, first step 1004 enables a desired word line. FIG. 4 illustrates this step by providing a high voltage level on word line lead 316. This turns on the gates to memory cell transistors 302, 304, 406, 408, 410, 412, 414, and 416 and will subsequently allow their states to be determined. In the present embodiment, only one word line is enabled at a time. Otherwise, ambiguity would arise when two or more memory cell transistors were activated as a result of two or more word lines enabled at the same time a bitline was enabled.

The next step in FIG. 9 is step 1006, enable a single desired bitline. This step allows a single memory cell transistor to be accessed within the enabled word line that contains multiple memory cell transistors, as described in one embodiment of the present invention. For example, if 'bit 0' bitline 320 in FIG. 3 is desired to be accessed, then bitline 320 would be enabled. FIG. 5 illustrates how a bitline would be enabled. In the example presented, bitline 320 is enabled by a low voltage level signal applied to column enable lead 510. This signal turns precharge transistor 530 'on', thereby allowing communication for a precharge signal from precharge lead 540, and turns grounding transistor 520 'off', thereby uncoupling bitline 320 from ground 590. While the present embodiment utilizes a low signal to enable a desired bitline and a high signal to disable an undesired bitline, the present invention is also suited to using reversed respective signals to accomplish this step.

In step 1008 of FIG. 10, all undesired bitlines are grounded. This step prevents cross-talk between adjacent bitlines from altering the true performance of a desired bitline. The interaction between adjacent bitlines is commonly referred to as coupling capacitance because the bitlines are conductors and they are separated by an insulator, thereby yielding a capacitor. By grounding adjacent undesired bitlines, any possible residual voltage level will discharge to ground. As a grounded line having zero voltage, undesired bitlines will have substantially reduced effect on the precharge of the desired bitline, and the subsequent sensing operation. Consequently, noise margins are improved by this step of eliminating one source of noise. Additionally, speed performance of precharging and sensing operations is improved because transient effects have been essentially eliminated from adjacent undesired bitlines. In the present embodiment, the grounding of undesired bitlines 1008 is performed simultaneously with the enabling of a desired bitline 1006. In this fashion, the grounding step 1008 that is beyond the conventional method does require additional time beyond the enabling step 1006.

Step 1008 is implemented as shown in FIG. 5 where grounding transistor 520 is coupled to ground 590. Note that grounding transistor 520, a NMOS configuration, and precharge transistor 530, a PMOS transistor, form a complementary metal oxide semiconductor (CMOS) pair. In this fashion, precharge step 1010 and grounding step 1008 are performed simultaneously when gates of the CMOS are enabled by step 1006. If, for example, 'bit0' bitline 320 were desired, all adjacent undesired bitlines 321, 422, 423, 424, 425, 426, 427 would be grounded. Hence, their coupling capacitance cross-talk effect on desired bitline 320 would be minimized., Consequently, the noise level on desired bitline 320 is reduced, and accuracy of reading the bitline is enhanced.

In step 1010 of FIG. 10, the desired bitline is precharged. Precharging the desired bitline allows its logic level to be manifested. In the present embodiment, a high logic level of precharge is used. For example, if bitline 320 of FIG. 3 was desired and thereby enabled, it would be precharged to a high logic level. However, it would discharge to ground because it is coupled to low voltage source 322. Hence its low logic level of '0' would be manifested.

Next, in step 1012 of FIG. 10, the voltage level of the desired bitline is sensed to determine a logic level. This step allows the manifested logic level of a memory cell transistor to be determined. For example, because memory cell transistor 302 is coupled to low voltage source 322, when it was sensed after a precharge, it should have a voltage level equivalent to low voltage source 322, and hence be interpreted as a low logic level '0.'

Figure 11:
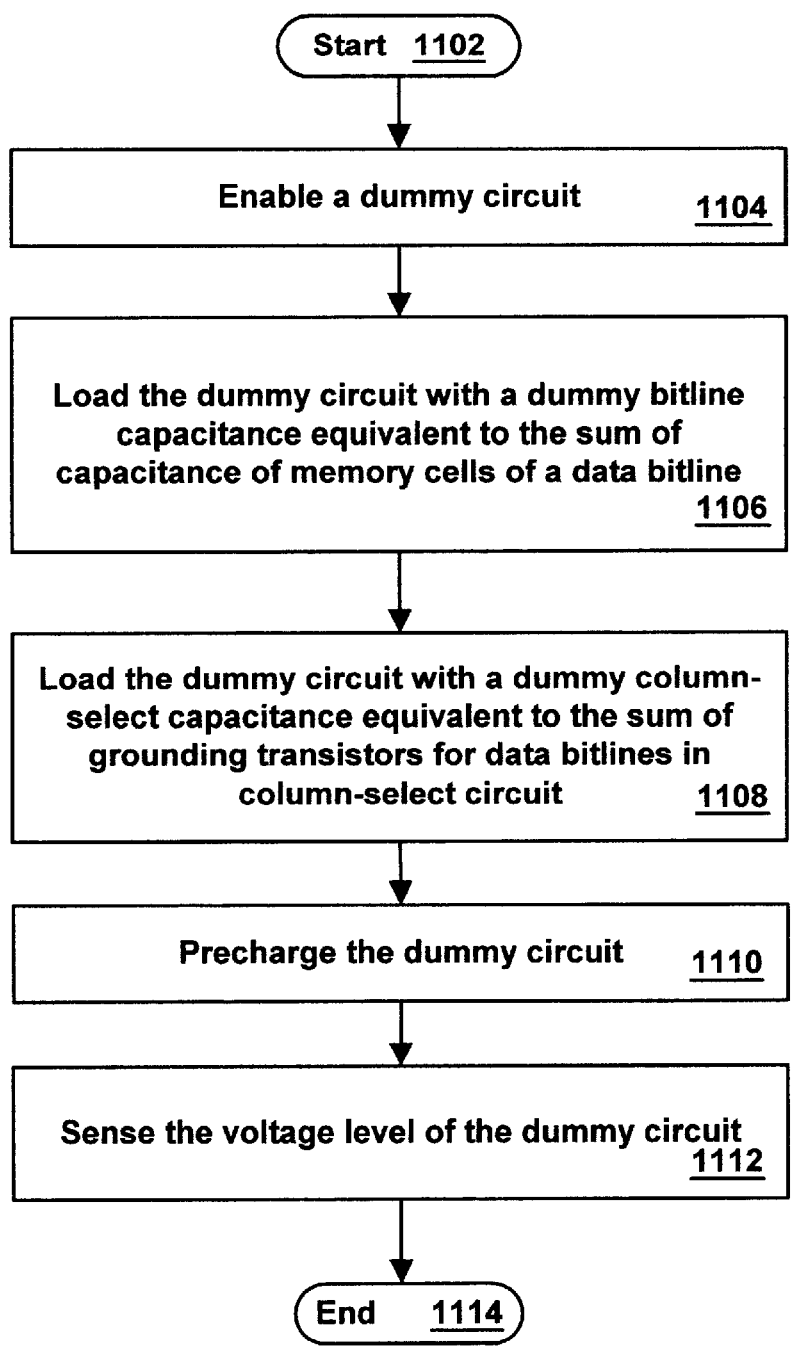
FIG. 11 is flow chart of the steps performed to create a dummy circuit with a capacitive load approximately equal to a bitline within a ROM circuit in accordance with one embodiment of the present invention.

Referring now to FIG. 11, a flowchart 1100 of the steps performed for enabling a dummy circuit 600 within a ROM memory circuit 300 of FIGS. 3–8 is presented. More specifically, FIG. 11 presents the steps for enabling a dummy circuit 600 with a capacitance matched to that of the sum of bitlines to which it will be compared. With the benefit of matched capacitance, dummy bitline now acts essentially the same as a bitline would. Consequently, any noise injected into the system should equivalently and simultaneously affect both bitline and dummy bitline. Thus, bitline and dummy bitline do not require additional time to allow transient and disparate performance to stabilize. They both read the same noise and transient conditions simultaneously. The end result is a matched system that will have faster performance. With matched capacitive performance, margins for noise unique to both the bitline and dummy bitline can increase.

In step 1104 of FIG. 11, a dummy circuit is enabled. This step is essentially the same as step 1004 of FIG. 10, but applied to a dummy circuit rather than a bitline. Consequently, in the present embodiment, dummy circuit is enabled by a low logic signal on the dummy circuit enable lead 616 as shown in FIG. 6.

Step 1106 of FIG. 11 loads the dummy circuit with a dummy bitline having a capacitance approximately equivalent to the sum of capacitance of memory cells in a bitline. In this manner, the capacitive load effects, e.g. phase shift, of a bitline are reflected in the dummy circuit. Consequently, the aforementioned benefits of matched performance are obtained.

Step 1106 is illustrated in FIGS. 4 and 6. Dummy circuit 600 of FIG. 6 has two memory cell transistors, 609 and 610. They represent the capacitive load of a typical two memory cell transistor bitline 320, 321, 422, 423, 424, 425, 426, and 427 as found in FIG. 4. Although the present embodiment illustrates only two memory cell transistors in a bitline, the quantity of memory cell transistors could be less or more. However, the capacitive load of both the bitline and the dummy circuit should be matched. While the present embodiment accomplishes matched capacitance by using the same quantity of transistors, the present invention is well suited to using alternative quantities and transistor properties to accomplish the goal of matched capacitance. Additionally, the present embodiment utilizes channel lengths in memory cell transistors 609 and 610 that are approximately half that of memory cell transistors, 302 and 418 for example, of a bitline, 320 for example. In this manner, the speed of the bitline is enhanced?

In step 1108 of FIG. 11, the dummy circuit is loaded with a dummy column-select circuit having a capacitance value approximately equivalent to the sum of grounding transistors 521, 522, 523, 524, 525, 526, and 527 in the column select circuit 500 of FIG. 5, coupled to bitlines. Note that only seven grounding transistors are included in the sum. The capacitance of the last grounding transistor, 520 for example for the desired bitline 320, is matched by the capacitance of the grounding transistor 606 within the dummy circuit 600. Thus, in general, the dummy column-select circuit has a capacitance equivalent to the sum, minus one, of grounding transistors for bitlines to which the dummy circuit will be compared. While the present embodiment utilizes discrete transistors 610, 611, 612, 613, 614, 615, and 616 to match the grounding transistors 521, 522, 523, 524, 525, 526, and 527 found in column-select circuit 500, the present invention is equally well suited to alternative methods of matching capacitance such a single large transistor with equivalent capacitance.

Step 1110 of FIG. 11 precharges the dummy circuit. This step is essentially identical to step 1010 of FIG. 10 as applied to a dummy circuit. Precharging the dummy circuit allows the logic level of the dummy bitline to be manifested. In the present embodiment, a high logic level of precharge is used. However, it would discharge to low logic level because it is coupled to low voltage source 322. Hence its low logic level of '0' would be manifested.

Next, in step 1112 of FIG. 11, the voltage level of the dummy bitline is sensed to determine its logic level. This step, essentially identical to step 1012 of FIG. 10, allows the manifested logic level of a memory cell transistor to be determined. For example, because memory cell transistor 609 is coupled to low voltage source 322, when it is sensed after a precharge it should have a voltage level equivalent to low voltage source 322, and hence should be interpreted as a low logic level '0.' This situation occurs because all memory cell transistors in the present embodiment are coupled to low voltage source 322 such that regardless of what word line 316 or 404 is selected, the logic level of dummy circuit 600 is always the same, a low logic level. Flowchart 1100 concludes with an 'end' step 1114.

Figure 12:
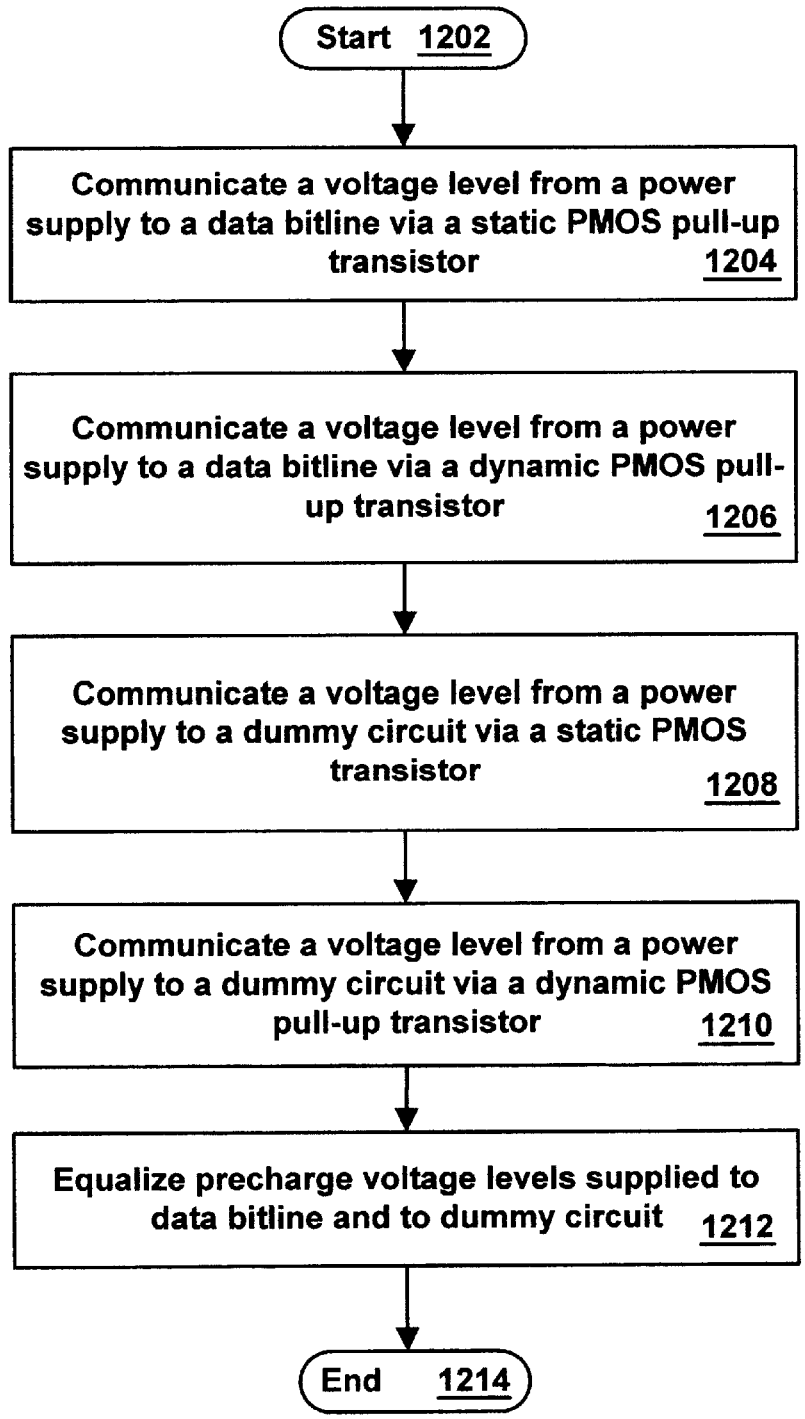
FIG. 12 is flow chart of the steps performed to precharge bitlines and dummy bitlines using low power-supply voltage within a ROM circuit in accordance with one embodiment of the present invention.

Referring now to FIG. 12, a flowchart 1200 of the steps performed for a precharge operation of a ROM memory circuit 300 of FIGS. 3–8 is presented. FIG. 7 presents the implementation of steps for flowchart 1200.

In step 1204 a voltage level from a power supply is communicated to a bitline via a static pull-up transistor. As indicated in FIG. 7, static pull-up transistor 704 is always coupled to power supply 713, presumably ground, and therefore is static, e.g. always turned on.

Step 1206 states that a voltage level from a power supply is communicated to a bitline via a dynamic pull-up transistor. In the present embodiment, the dynamic pull-up transistor for the bitline is in parallel to the static pull-up transistor for the bitline. In this manner, the current capacity of precharge circuit 700 is enhanced thereby ensuring that the voltage level of the power supply 710 and 712 is maintained. In the present embodiment, the dynamic pull-up transistor is coupled to a precharge enable lead 701. Hence it only turns on when it is enabled. When the enable is not present, the transistor turns off and hence dynamically changes its state. Beneficially, the dynamic pull-up transistor enhances the bit swing of the bitline. In this manner, a faster and more precise voltage level can be established for the precharge lead 540 coupled to bitlines.

Step 1208 of FIG. 12 is essentially identical to step 1204 but applied to a dummy circuit instead of a bitline. In this manner, dummy circuit 600 can receive a precharge in an essentially identical fashion as bitlines in FIG. 4.

Likewise, step 1210 of FIG. 12 is essentially identical to step 1206 but applied to a dummy circuit instead of a bitline. In this manner, dummy circuit 600 can receive a precharge with enhanced bit swing performance as do bitlines of FIG. 4.

In the present embodiment, all pull-up transistors have a PMOS configuration. In this manner, low voltage power supplies can effectively operate ROM circuit 300. PMOS transistors are more desirable than NMOS transistors because of the voltage conditions required for operation. For example, NMOS transistors would required a Vgs, gate to source voltage that is greater than the Vt, threshold voltage. Hence, the voltage at source 716 would have to be less than the voltage at gate 717. For a given maximum power supply voltage, Vmax, applied to the gate, the source voltage could only rise up to Vmax–Vt. However, with the present embodiment, a PMOS transistor, the voltage level of the source can be essentially equivalent to the Vmax. This occurs because, if source 716 is at Vmax and gate 717 is at zero voltage then Vgs exceeds Vt and the transistor conducts.

In step 1212, precharge voltage levels supplied to both bitline and dummy circuit are equalized. As done in other embodiments of the present invention, the present embodiment of equating a step performed on both the bitline and dummy bitline reduces noise in the circuit, enhances accuracy and improves speed of ROM circuit 300. In the present embodiment, as illustrated in FIG. 7, equalizing PMOS transistor 746 couples the pull-up transistors 704 and 702 coupled to bitline matrix 400 and the pull-up transistors 722 and 724 coupled to dummy circuit 600. Because the present embodiment utilizes a PMOS configuration transistor, the voltage level at the gate 740 of equalizing transistor 746 does not have to be greater than the voltage level at one of the electrodes 742 or 744. Hence, essentially, the full voltage level of power supplies 710, 712, 730 and 732 is provided to bitline matrix 400 and dummy circuit 600. While the present embodiment illustrates six different power supplies 710, 712, 713, 730, 732 and 738, the present invention is well suited to alternative arrangements such as a single power supplies.

Figure 13:
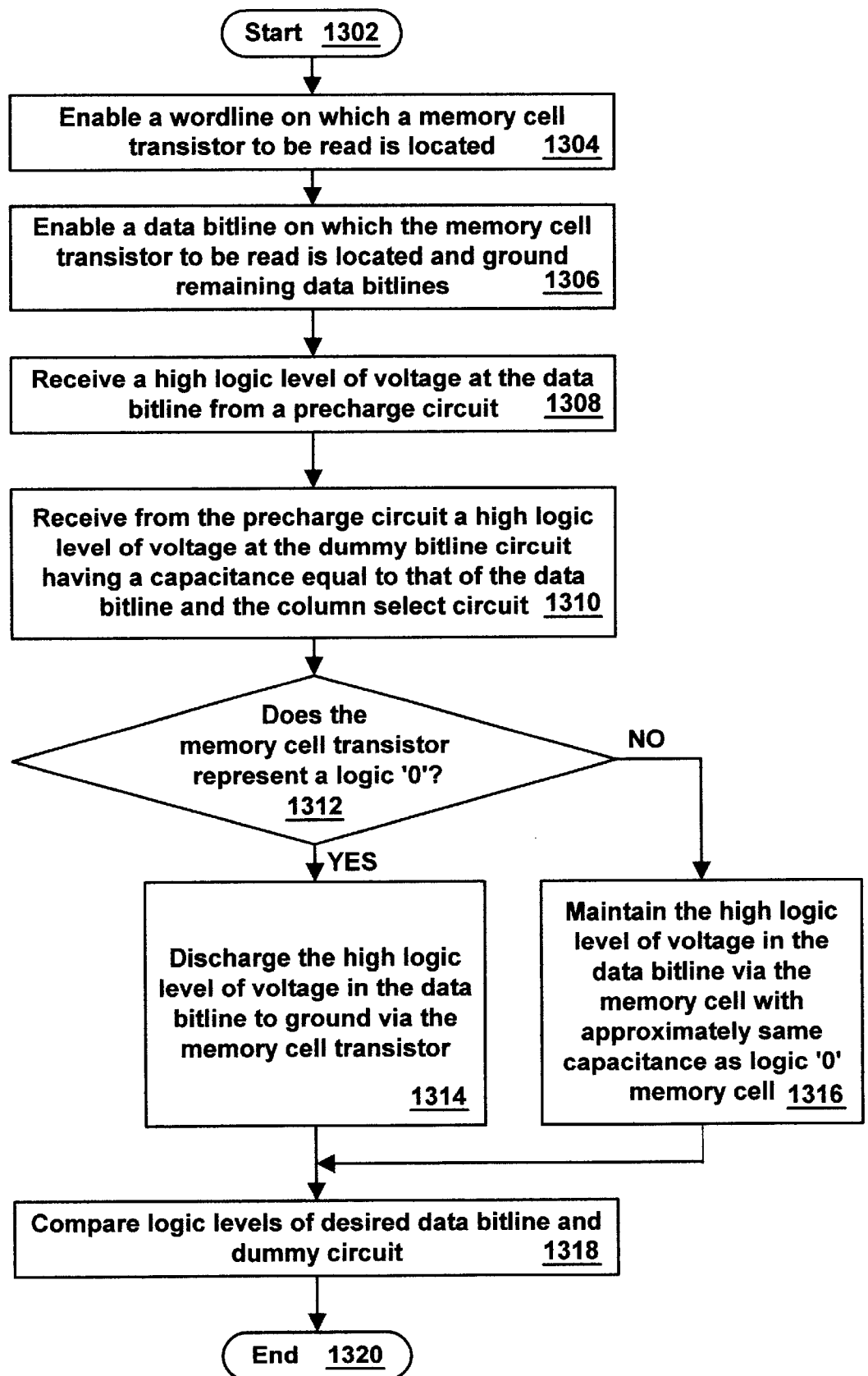
FIG. 13 is flow chart of the combination of steps performed to read a memory cell transistor within a ROM circuit in accordance with one embodiment of the present invention.

Referring now to FIG. 13, a flowchart 1300 of the steps performed for the overall operation of a ROM memory circuit 300 of FIGS. 3–8. Flowchart 1300 essentially provides the continuous and integrated steps from FIGS. 9–12 as applied to a ROM memory circuit 300 with added enhancements to the output of the ROM circuit 300.

As shown in FIG. 13, in first step 1304 a word line is enabled. This step is essentially identical to step 1004 of FIG. 1000. In this step a word line, or row, of data memory cells is enabled by a logic level of signal appropriate to the transistor configuration used for the data memory transistor. Subsequently, a specific data memory cell within the word line of data memory cells may be accessed by a bitline.

As shown in FIG. 13, second step 1306 enables a bitline on which the desired memory cell transistor to be read is located, and grounds the remaining undesired bitlines. This step is essentially identical to step 1006 and 1008 of FIG. 1000. Step 1306 allows a specific data memory transistor within a data memory cell matrix 400 to be accessed. As mentioned for FIG. 1000, this steps reduces coupling capacitance between adjacent bitlines, thereby enhancing performance of ROM circuit 300.

Step 1308 states that an equalized high logic level of voltage is received at the desired bitline from a precharge circuit. This step essentially incorporates a the steps provided of FIG. 7 for the bitline. Step 1306 only allows the high logic level of voltage of step 1308 to be communicated to a desired bitline. The undesired bitlines are uncoupled from precharge lead 540, and hence do not receive the precharge voltage level.

In step 1310, a high logic level of voltage is received at the dummy circuit. This step essentially incorporates the steps of FIG. 7 for the dummy circuit. In the present embodiment, both the desired bitline and the dummy circuit are energized at approximately the same time. In this fashion, their performance is matched during precharge. Step 1310 indicates that dummy circuit has approximately the same capacitance as that of the desired bitline and as the appropriate portion, as indicated for FIG. 6, of column-select circuit 500.

In step 1312, a query is presented as to whether the memory cell transistor represents a logic '0.' The 'yes' and 'no' response to this question represents the binary choice in digital circuits. If the response to step 1312 is yes, then step 1314 is implemented. Otherwise, step 1316 is implemented.

In step 1314 of FIG. 1300, the desired memory cell transistor discharges the high logic level of voltage received from precharge circuit 700. This step is the result of the memory cell transistor being configured as a logic '0' in step 912 of FIG. 9.

In contrast, in step 1316 of FIG. 1300, the desired memory cell transistor maintains the high logic level of voltage received from precharge circuit 700. This step is the result of the memory cell transistor being configured as a logic '1' in step 914 of FIG. 9.

In step 1318, a cross-coupled sense amplifier compares the logic levels, after the precharge step, of the desired bitline and dummy circuit. In this manner, noise in the system can be accounted for by allowing the logic level from the dummy circuit, representing a standardized logic level, to encounter the same noise the bitline encounters.

Finally, in step 1320 of FIG. 1300, an output latch holds the logic level received from the cross-coupled sense amplifier. The output latch is a low-power method of maintaining an output value until it changes.

Thus, the present invention provides a data memory transistor, for use within a ROM circuit, that has more consistent capacitive loading on the bitline in both the logic 0 state and the logic 1 state. The present invention further provides a precharge circuit, for use within a ROM circuit, with the capability to provide an acceptable voltage level to the memory cell and the reference cell at low-voltage power supply conditions. The precharge circuit of the present invention can also precharge the cells in a faster manner. Additionally, the present invention provides reduced noise in the voltage level supplied to the memory cell and reference cell during the precharge operation. Furthermore, the present invention provides a dummy bitline configuration with approximately equivalent capacitance as a bitline such that sensing speed and accuracy may be enhanced. Finally, the present invention provides reduced cross-talk between adjacent bitlines and reducing its negative side-effects.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

I claim:

1. A precharge circuit for providing low-operating voltage capability to a read only memory (ROM) circuit, said precharge circuit comprising:
   a precharge enable line, said precharge enable line provided to enable a precharge circuit;
   a power supply; and
   a plurality of PMOS pull-up transistors, said plurality of PMOS pull-up transistor provided to communicate the voltage level of said power supply to at least one bitline, a dummy bitline, and a dummy column-select load circuit, said precharge enable line coupled to at least one of said PMOS pull-up transistors, said power supply coupled to said plurality of PMOS pull-up transistors.

2. The precharge circuit as recited in claim 1 wherein two of said plurality of PMOS pull-up transistors are grouped together to supply a voltage level to said at least one bitline, and wherein two of said PMOS pull-up transistors are grouped together to supply a voltage level to said dummy bitline.

3. The precharge circuit as recited in claim 2 further comprising:
   a bitline equalizing transistor, said bitline equalizing transistor coupled to said precharge enable line, said bitline equalizing transistor coupled to said first pair of PMOS pull-up transistors, and said bitline equalizing transistor coupled to said second pair of PMOS pull-up transistors, said bit equalizing transistor providing noise immune voltage levels supplied from said precharge circuit to both said bitline and said dummy bitline.

4. The precharge circuit as recited in claim 1 wherein said plurality of PMOS pull-up transistors is comprised of:
- a first PMOS static pull-up transistor for providing the voltage level of said power supply to said at least one bitline, said first PMOS static pull-up transistor coupled to ground, to a power source, to a column select circuit for said at least one bitline, to a bitline side of a cross-coupled sense amplifier, and to a bitline equalizing transistor;
- a first PMOS dynamic pull-up transistor for providing the voltage level of said power supply to at least one bitline, said first PMOS dynamic pull-up transistor coupled to said precharge enable line, to said power source, and to said first PMOS static pull-up transistor;
- a second PMOS static pull-up transistor for providing the voltage level of said power supply to said dummy bitline and to said dummy column-select load circuit, said second PMOS static pull-up transistor coupled to ground, to said power source, to a column select circuit for said dummy bitline, to a reference-input of said cross-coupled sense amplifier, to said dummy column-select load circuit, and to said bitline equalizing transistor; and
- a second PMOS dynamic pull-up transistor for providing the voltage level of said power supply to said dummy bitline and to said dummy column-select load circuit, said second PMOS dynamic pull-up transistor coupled to said precharge enable line, to said power source, and to said source of said second PMOS static pull-up transistor.

5. In a read only memory (ROM) circuit, a method of selecting and precharging one bitline in a manner that reduces coupling capacitance on it from adjacent bitlines, said method comprising the steps of:
- a) enabling a desired bitline;
- b) grounding each non-desired bitline that is coupled to said desired bitline;
- c) precharging said desired bitline; and
- d) sensing the voltage level of said desired bitline.

6. The method as recited in claim 5 wherein said step a) comprises the step of:
receiving a logic level at a transistor coupled to said non-desired bitline, for each said non-desired bitline that is coupled to said desired bitline, such that each said non-desired bitline is also coupled to ground.

7. The method as recited in claim 5 wherein said step b) comprises the step of:
receiving a low logic voltage level at a transistor coupled to said desired bitline such that said desired bitline is decoupled from ground.

8. The method as recited in claim 5 wherein said step c) comprises the step of:
- receiving a low logic voltage level at a first precharge transistor coupled to said desired bitline such that said desired bitline is coupled to a precharge circuit; and
- receiving a high logic voltage level at a plurality of precharge transistors respectively coupled to each of said non-desired bitlines such that all said non-desired bitlines are decoupled from said precharge circuit.

9. In a read only memory (ROM) circuit, a method of precharging data memory cells in a ROM circuit using a low power-supply voltage level, said method comprising the steps of:
- communicating a first voltage level to a bitline, said first voltage level approximately equivalent to a power supply voltage level;
- communicating a second voltage level to a dummy circuit, said second. voltage level approximately equivalent to said power supply voltage level; and
- equalizing said first and said second voltage level communicated to said bitline and said dummy circuit.

10. The method as recited in claim 9 wherein said first and said second voltage levels are communicated by a first pair of precharge transistors coupled to a power source and a second pair of precharge transistors coupled to said power source, said step of equalizing said first voltage level and said second voltage level performed by an equalization PMOS transistor coupled between said first pair of precharge PMOS transistors and said second pair of precharge PMOS transistors.

11. The method as recited in claim 10 wherein said first voltage level is communicated by a first dynamic PMOS pull-up transistor and a first static PMOS pull-up transistor, said second voltage level is communicated by a second dynamic PMOS pull-up transistor and a second static PMOS pull-up transistor.

* * * * *